United States Patent [19]
Cox

[11] Patent Number: 4,645,689
[45] Date of Patent: Feb. 24, 1987

[54] DEPOSITION TECHNIQUE

[75] Inventor: Herbert M. Cox, Berkeley Heights, N.J.

[73] Assignee: AT&T Bell Laboratories, Murray Hill, N.J.

[21] Appl. No.: 771,172

[22] Filed: Sep. 3, 1985

Related U.S. Application Data

[63] Continuation of Ser. No. 581,326, Feb. 17, 1984, abandoned.

[51] Int. Cl.$^4$ ......................................... H01L 21/205
[52] U.S. Cl. ................... 427/87; 427/255.2; 156/613; 156/614; 156/DIG. 70; 156/DIG. 81
[58] Field of Search ............... 427/87, 255.2; 156/610, 156/613, 614, DIG. 70, DIG. 81

[56] References Cited

U.S. PATENT DOCUMENTS 3,888,705 6/1975 Fletcher et al. ................. 156/614 X
4,116,733 9/1978 Olsen et al. ...................... 156/614 X

FOREIGN PATENT DOCUMENTS 53-17066 2/1978 Japan .................................... 156/614

OTHER PUBLICATIONS

*Journal of Crystal Growth*, vol. 46, No. 2, 1979, pp. 205-208.
Shaw, "Influence of Substrate Temperature on GaAs Deposition Rates", J. Electrochem. Soc.: Solid State Science, vol. 115, No. 4, pp. 405-408, Apr., 1968.
Chatterjee et al., "Vapor Phase Hetero-Epitaxy: Growth of GaInAs Layers", *Journal of Crystal Growth*, vol. 56, 1982, pp. 591-604.
Vohl, "Vapor-Phase Epitaxy of GaInAsP and InP", *Journal of Crystal Growth*, vol. 54, 1981, pp. 101-108.
Shaw, "Kinetics of Transport and Epitaxial Growth of GaAs with a Ga-AsCl$_3$ System", *Journal of Crystal Growth*, vol. 8, 1971, pp. 117-128.

*Primary Examiner*—John D. Smith
*Assistant Examiner*—V. Dang
*Attorney, Agent, or Firm*—Bruce S. Schneider

[57] ABSTRACT

Devices such as photodiodes based on III-V semiconductor materials have been made utilizing a CVD epitaxial procedure. This procedure includes, for example, the use of a combination of liquid and solid chloride transport sources.

28 Claims, 4 Drawing Figures

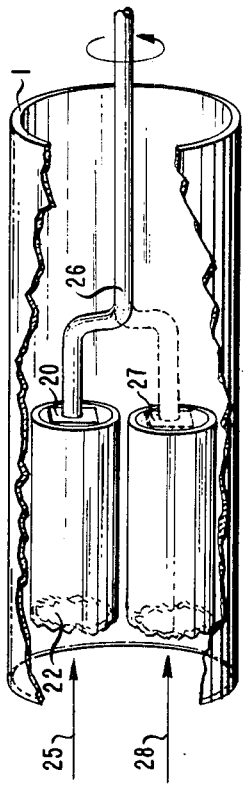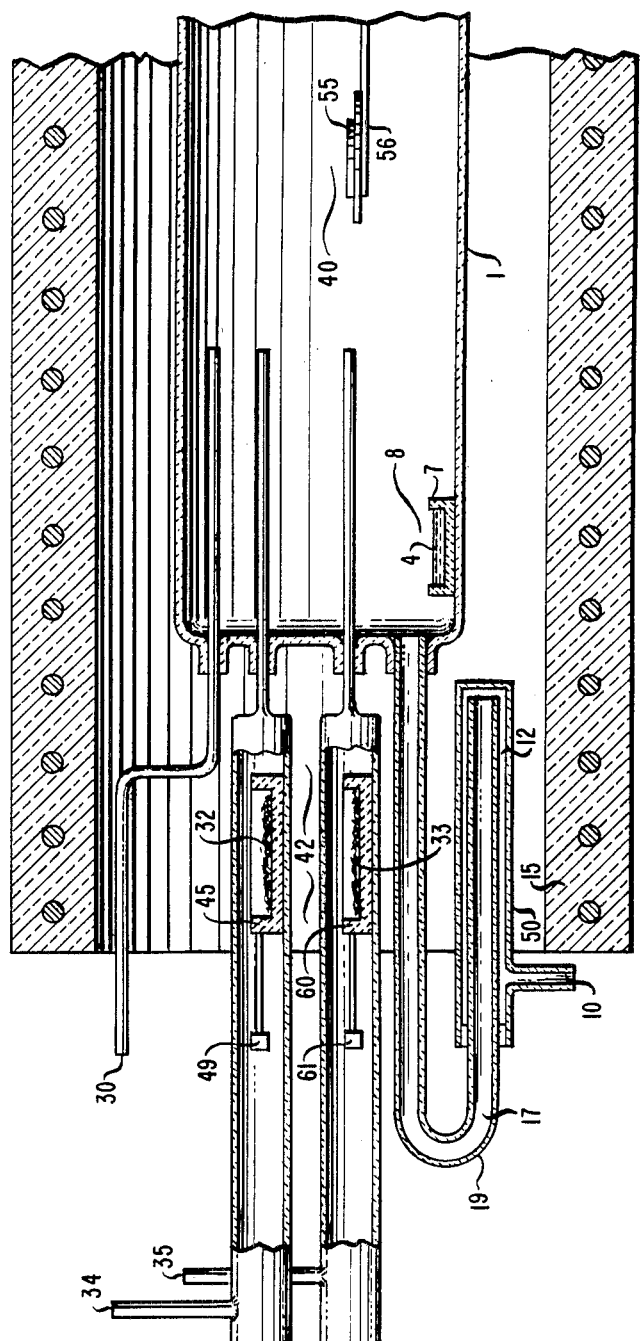

DEPOSITION TECHNIQUE

This application is a continuation of application Ser. No. 581,326, filed Feb. 17, 1984, now abandoned.

BACKGROUND OF THE INVENTION

1. Field of the Invention

This invention relates to the fabrication of semiconductor devices and, in particular, to the fabrication of III–V semiconductor devices.

2. Art Background

Many processes have been developed for the deposition of materials, e.g., semiconductor materials, on a substrate. One such process involves the use of a precursor gas, i.e., a gas that upon contact with the substrate undergoes a modification such as a chemical reaction to yield a deposited layer. The precursor gas is formed and flowed through a reactor tube to the deposition substrate. Although the precursor gas is generally formed by combining flows from multiple gas sources, typically there is only one combined precursor flow being generated during the deposition procedure.

The single precursor flow has the advantage of producing deposited layers having relatively uniform thickness on substrates of substantial size, i.e., having an area of 1 square inch or more. Generally, however, a semiconductor device such as a photodetector, e.g., a p-i-n photodetector, includes a plurality of sequentially deposited semiconductor layers of differing compositions. If a single precursor flow within a reactor is utilized, the composition of this flow must be changed for each subsequent layer deposition. Because gas flows cannot be immediately terminated or initiated, the region at the interface of sequentially deposited layers generally contains undesirable composition fluctuation between the two layer compositions. Undesirable fluctuation, in the context of this disclosure, is defined by comparing the peaks obtained by taking the X-ray diffraction rocking curve, as described by R. W. James in *The Optical Principles of the Diffraction of X-Rays*, Vol. II of *The Crystalline State*, Cornell University Press, Ithaca, N.Y., of the deposition structure, including the substrate and the desired epilayers. An epilayer deposition results in an undesirable composition fluctuation if the width of the X-ray rocking curve corresponding to this layer measured at $\frac{1}{2}$ the peak height is greater than two times the width measured at $\frac{1}{2}$ the peak height for the rocking curve corresponding to the substrate.

It is often desirable in semiconductor devices such as photodetectors to avoid undesirable interface composition fluctuations. Various techniques have been developed to accomplish this goal. Exemplary of these techniques is a process utilizing a dual precursor gas flow reactor such as shown in FIG. 1. Basically, the substrate, 20, is positioned at the orifice of a tube, 22, so that its major surface is perpendicular to the long axis of the tube. The first precursor gas flow, 25, is then directed along the tube, emerges from the tube, and contacts the substrate. If two such tubes are employed, then it is possible to establish a second precursor gas flow, 28, in the second tube before terminating or modifying the first flow. By a translational shift such as an eccentric rotation around an external shaft as shown at 26, the substrate is first subjected to one gas flow and then to the second at 27. In this manner, deposited layers having different compositions are sequentially formed on a substrate by a corresponding sequential exposure to the two flows.

Techniques utilizing such a plurality of precursor flows that simultaneously exist (at least during the period when the substrate is being transferred from one flow to another) advantageously produce transitional regions between layers with composition fluctuations that are less severe than that obtained by changing or modifying the precursor gas in the previously discussed single gas flow methods. However, as can be seen from FIG. 1, the geometry of the multiple precursor flow technique requires a relatively large reactor tube, 1, in comparison to the size of the substrate, 20. As a result, the quartz reactor tube is significantly harder to fabricate, much higher flow rates are required, and a substantially more sophisticated heating system is required to compensate for increased heat loss. Thus, for practical reasons, the use of a multiple precursor flow reactor has generally been limited to the deposition of epitaxial layers on substrates having an area substantially smaller than 1 square inch. Since it is now typically desired that production of devices such as p-i-n photodetectors be done by fabrication processes involving substrates having areas of 1 square inch and larger, reported multiple flow techniques have a significant limitation. Additionally, the thickness and composition uniformity of the deposited layer in a multiple precursor flow configuration is also generally significantly poorer than that achieved with single flow configurations. If an attempt is made to increase substrate area without increasing reactor size by depositing on a substrate whose major surface is positioned parallel to the longitudinal axis of the reactor tube, the already diminished uniformity is further decreased. Thus, for many applications, a multiple precursor flow reaactor is undesirable due to limitations on substrate diameter and deposited layer uniformity, while a single flow reactor generally leads to disadvantageous composition fluctuations between layers.

In addition to factors concerning thickness uniformity, substrate size, and composition fluctuations in the interface regions, it is desirable to control the purity of the deposited layer. (Purity is measured by the free carrier concentration of the layer in the absence of an intentionally introduced dopant.) The most commonly employed gas source employed in forming the precursor gas flow is produced by passing a gas over a liquid having a solid overlying crust. Use of such a two-phase body in producing the source flow generally yields excellent purity control but lacks excellent control over composition. (Control over composition is important in ternary and quaternary materials where a variety of stoichiometries between the constitutent elements exists but where, for a given application, only a narrow range of stoichiometries is acceptable.) The two-phase source generally involves a molten Group III element, e.g., gallium or indium, that has been saturated with a Group V material to produce a solid crust, e.g., a gallium arsenide or indium phosphide crust, over the molten liquid. For example, by flowing arsenic trichloride over molten gallium, a gallium arsenide crust is formed over the molten gallium, and species such as gallium chloride and $As_4$ are formed by interaction of the two-phase source with the arsenic trichloride flow. These species are then typically combined with other species to produce the precursor gas flow. Although high purity deposited layers result, composition control depends on the maintenance throughout deposition of a crust with essentially constant dimensions relative to the underlying liquid. This maintenance is difficult to consistently achieve and leads to fluctuations in the composition of the precursor gas flow. (See *Journal of Crystal Growth*, 8, D. Shaw, page 117 (1971).) Solid source gas flows generated, for example, by passing arsenic trichloride over heated gallium arsenide or phosphorus trichloride over heated indium phosphide have also led to substantially reduced purity with no means of controlling the ratio of Group V to Group III elements in the final gas flow. (See *Journal of Crystal Growth*, 54, P. Vohl, pages 101-108 (1981).)

In contrast, a liquid source gas flow, e.g., a molten indium source subjected to a hydrogen chloride flow and combined with arsine and/or phosphine, has been utilized to avoid control problems. However, this approach generally leads to a relatively high level of impurity incorporation into the deposited layer, as noted by a relatively high free carrier concentration, i.e., greater than $10^{15}$ cm$^{-3}$, in the absence of intentional doping. On the other hand, a liquid source gas flow, e.g., a molten indium/gallium alloy subjected to a hydrogen chloride flow that is combined with an arsenic trichloride flow, has been utilized to avoid impurity difficulties. By utilizing the liquid source gas flow, high purity for indium gallium arsenide has been reported. However, composition control is difficult since the ratio of gallium to indium must be maintained during each deposition and from one deposition to another by suitable replenishment of the consumed gallium. Additionally, the deposition rate for the resulting layer is quite low, e.g., less than 2 $\mu$m/hour. (See *Journal of Crystal Growth*, 56, A. K. Chatterjee et al, page 591 (1982).) Thus, even if layer uniformity is achieved with limited composition fluctuations in interface regions, it is extremely difficult to obtain these attributes while additionally producing a high purity layer with controlled composition at an economic deposition rate.

SUMMARY OF THE INVENTION

By the use of a specific combination of gas flow sources to form the precursor gas flow, multiple epitaxial layers having well-controlled compositions and excellent purity are deposited at quite resonable rates. Additionally, this combination of gas flow sources, when employed in a single precursor gas configuration, yields surprisingly narrow X-ray peaks indicative of small composition fluctuations in the interface regions on relatively large substrates, e.g., 2-inch substrates, with excellent thickness uniformity. The desirable results of the invention are produced by employing at least one liquid source gas flow in combination with at least one solid source gas flow to form the various precursor gases to be utilized in sequential layer deposition. These gas flow sources include, for example, liquid source gas flows such as molten indium or gallium contacted by flowing hydrogen chloride, and solid source gas flows such as either gallium arsenide or indium phosphide interacting with a suitable chloride flow, e.g., arsenic trichloride and phosphorus trichloride, respectively.

By employing the inventive technique, semiconductor devices, e.g., p-i-n diodes, are producible. For example, if a separate phosphorus trichloride flow is combined with the gas flow from the liquid source, etching of the III-V semiconductor substrate, e.g., an n+ indium phosphide substrate, occurs. By terminating the separate phosphorus chloride flow and initiating the indium phosphide source gas flow by passing phosphorus trichloride over indium phosphide, indium phosphide is deposited. By then again terminating the solid indium phosphide source gas flow by terminating its phosphorous trichloride flow, and initiating the solid gallium arsenide source gas flow by flowing arsenic trichloride over the gallium arsenide, indium gallium arsenide is deposited. Thus, through a sequence of terminating only portions of the precursor flow, it is possible with subsequent conventional processing to produce a device such as a p-i-n photodiode with excellent control over composition, excellent purity, thickness uniformity, and with smaller composition fluctuations than are associated with single precursor flow deposition procedures.

BRIEF DESCRIPTION OF THE DRAWING

FIG. 1 is illustrative of multiple precursor flow techniques;

FIG. 2 is illustrative of single precursor flow techniques involved in the invention.

DETAILED DESCRIPTION

Figure 3:
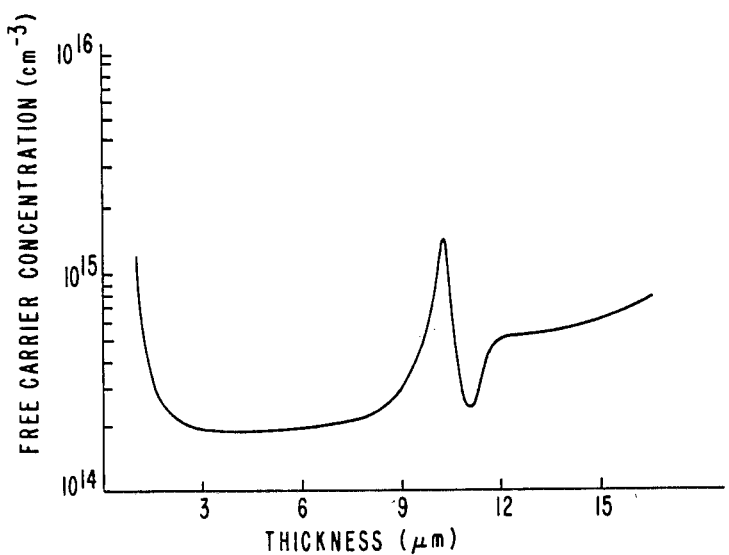
FIGS. 3 and 4 illustrate results achieved with the inventive technique.

Substrate holders and downstream reactor configurations typically associated with chemical vapor deposition of III-V semiconductor materials (including binary, ternary, and quaternary materials) are useful in the practice of the invention. For example, in a single precursor flow configuration, it is desirable to utilize a rotating substrate, such as described in *Institute of Physics Conference, Series Number* 65, H. M. Cox et al, Chapter 2, page 133 (1983), to ensure deposition uniformity. It is also advantageous to direct the effluent flow through an easily replaceable outlet as described in Cox et al supra. For multiple precursor flows, configurations such as shown in FIG. 1 or as discussed in co-pending, co-assigned U.S. Pat. Application Ser. No. 566,918, filed Dec. 30, 1983 (which is hereby incorporated by reference) are employed. Additionally, the reactor tube, 1 in FIGS. 1 or 2, is conveniently formed from vitreous quartz.

The gas flow sources to be utilized include at least one liquid source gas flow and at least one solid source gas flow. (Additionally, although not essential, it is desirable to include a means for introducing phosphorus trichloride and/or arsenic trichloride into the precursor flow.) The liquid source gas flow should include the use of a liquid such as molten indium or gallium, 4 in FIG. 2, essentially in the absence of a crust. This source is easily produced by introducing a liquid such as indium or gallium into a boat, such as a quartz boat, and heating the boat, for example, by maintaining the boat, 7, in a heated region, 8, of the reactor tube, 1. The molten indium or gallium is then subjected to a flow including a chloride containing entity such as hydrogen chloride or chlorine. (Use of chlorides such as arsenic trichloride and phosphorus trichloride is acceptable provided that during the deposition, a crust is essentially avoided by limiting the amount of Group V element present to less than its solubility limit in the liquid at the source temperature.) It is desirable that the chlorine containing entity flow not include a substantial level of impurities. It has been found that relatively pure hydrogen chloride is advantageously produced by cracking arsenic trichloride. Thus, in one embodiment, arsenic trichloride and hydrogen are introduced at inlet, 10, and flowed through a region, 12, heated, for example, by the furnace, 15. The heat causes decomposition of the arsenic trichloride, and the remaining chloride entities combine with the hydrogen to produce relatively pure hydrogen chloride. If the resulting effluent is then directed to a relatively cool region, 17, arsenic from the decomposition deposits onto tube walls, 19. Hydrogen flow rates and arsenic trichloride flow rates strongly depend on the composition ultimately to be deposited. A control sample is utilized to determine suitable flow rates for a given composition. For example, the ratio of molar flow rates of hydrogen to phosphorus trichloride and arsenic trichloride for indium phosphide and indium gallium arsenide, respectively, on the order of 10 to 10,000 are useful. A region having a temperature above 700 degrees C. is utilized to crack the arsenic trichloride, and a region having a temperature less than 200 degrees C. is sufficient for condensing the resulting arsenic. The hydrogen chloride flow is then introduced into the vicinity of molten indium or gallium. Typically, indium or gallium surface areas in the range 15 to 100 cm$^2$, in combination with the previously described hydrogen chloride flow, produce a suitable gas for introduction into the deposition precursor gas. (See *Japanese Journal of Applied Physics*, 16, K. Sugiyama et al, page 2197 (1979) for the use of arsenic trichloride cracking in another context.)

At least one solid source gas flow is also employed. Suitable solid sources include those containing heated indium phosphide or heated gallium arsenide or heated indium arsenide. (The temperature to which the solid material is heated should be sufficient to produce reaction between the solid and a suitable gaseous chloride containing entity. Typical temperatures are those above 600 degrees C.) The heated III-V material, i.e., the gallium arsenide, indium arsenide, or indium phosphide, is then subjected to a chloride containing entity such as the chloride of the corresponding Group V element. Thus, for example, with indium phosphide, a chloride such as phosphorus trichloride is utilized, while with gallium arsenide or indium arsenide, a chloride such as arsenic trichloride is employed. The flow rates of the chloride containing entity again strongly depend on the composition of the layer to be deposited. A control sample is employed to determine a suitable flow rate for a desired composition. For example, arsenic chloride and phosphorus chloride containing flows are generated by passing a carrier gas flow such as a hydrogen flow through a bubbler containing the chloride. Carrier flows and the bubbler temperature are controlled to yield a chloride mole ratio to hydrogen gas typically in the range $10^{-4}$ to 0.1. Arsenic chloride or phosphorus chloride containing flows employed with gallium arsenide and indium phosphide, respectively, yield indium phosphide and indium gallium arsenide deposits. For adequate interaction between the III-V materials and the chloride containing entity such as their respective chlorides, generally III-V material surface areas greater than 2 cm$^2$ are utilized. (If desired, a doped deposited layer is produced by introducing the desired dopant into the precursor gas flow by conventional techniques such as introducing hydrogen sulfide or zinc vapor.)

The production of unexpectedly pure epitaxial layers at reasonable deposition rates is achieved by combining the use of at least one liquid source gas flow with at least one solid source gas flow to produce a desired precursor flow. For example, a liquid indium source gas flow with a solid gallium arsenide source gas flow yields indium gallium arsenide deposition, with a solid indium phosphide source gas flow yields indium phosphide deposition, and with both a solid gallium arsenide and solid indium phosphide source gas flow yields indium gallium arsenide phosphide. Similarly, a liquid gallium source gas flow with a gallium arsenide solid source gas flow yields gallium arsenide deposition, with an indium phosphide solid source gas flow yields indium gallium phosphide deposition, and with an indium arsenide solid source gas flow yields indium gallium arsenide deposition. For multiple precursor gas flows, at least one liquid source gas flow is employed with at least one solid source gas flow to produce each precursor flow. As a result, high purity layers with small composition fluctuations in interface regions and with easily controlled compositions are produced at a reasonable depositon rate. Further, if the combination of at least one liquid source gas flow with at least one solid source gas flow is employed in a single precursor flow configuration, and if the precursor flow is subsequently modified by change of the solid source gas flow, a composition change is induced and multiple layers deposited. The resulting interface quality is surprisingly maintained, while the additional advantage of thickness uniformity for deposition on relatively large substrates is achievable.

Typically, initially it is desirable to etch the substrate, e.g., an indium phosphide or gallium arsenide substrate, to remove contamination introduced during substrate handling. Although this step is not essential, it is easily accomplished by subjecting, for example, an indium phosphide or gallium arsenide substrate to the gas precursor from an indium or gallium liquid source, 4 in FIG. 2, with, respectively, a phosphorus trichloride or arsenic trichloride flow introduced, for example, at 30. The relative flows of phosphorus trichloride or arsenic trichloride to the liquid source gas flow depend strongly on the substrate and substrate temperature. (Substrate temperatures typically in the range 600 to 800 degrees C. are employed.) A control sample is employed in determining suitable levels for specific conditions.

After etching, if employed, the liquid source gas flow is continued for each precursor gas flow, the phosphorus trichloride flow is terminated, and at least one of the solid source gas flows is initiated for each precursor gas flow. (The solid source gas flow is easily initiated by subjecting the solid III-V material, e.g., 32 and 33, to an appropriate gaseous chlorine containing entity introduced, for example, at 34 and 35, respectively.) As discussed, by utilizing an indium phosphide solid source gas flow with, for example, an indium liquid source gas flow, indium phosphide is epitaxially deposited. By utilizing a gallium arsenide solid source gas flow with, for example, an indium liquid source gas flow, indium gallium arsenide is deposited. A wide range of flow ratios between the liquid and solid source gas flows produces indium phosphide (or gallium arsenide in the case of a liquid gallium source gas flow and a solid gallium arsenide source gas flow). The specific stoichoimetry, however, of the deposited indium gallium arsenide or indium gallium arsenide phosphide is controlled by, in turn, controlling the ratios between the solid source gas flow(s) and the liquid source gas flow(s). A control sample is easily utilized to determine the specific ratio which yields a desired stoichiometry. The combination of at least one solid source gas flow and at least one liquid source gas flow is continued until an epitaxial layer thickness of the desired dimension is attained. Typically, deposition rates in the range 3 to 10 μm/hour are obtained, requiring deposition times in the range of approximately 0.3 to 3 hours for representative layer thicknesses in the range 3 to 10 μm.

If deposition of a second layer is desired after the deposition of one epitaxial layer is completed, the substrate in a multiple precursor flow configuration is moved to the second precursor flow. In a single precursor configuration, the liquid source gas flow is maintained, and at least one of the solid source gas flows is modified. (Small changes in the liquid source gas flow rate, upon changing precursor gas composition, is acceptable and not precluded.) The requisite is that the solid source gas flow is changed by substituting one solid source gas flow for another, adding another solid source gas flow to existing one(s), or removing one solid source gas flow from a precursor flow containing a multiplicity of solid source gas flows. In the single precursor flow configuration, termination and initiation of a solid source gas flow are easily accomplished by the concomitant initiation or termination of the respective chlorine entity containing flows. (It is acceptable to use a gas such as hydrogen as a carrier for the desired chlorine entity. For purposes of this disclosure, the flow containing the chlorine entity irrespective of carrier is considered a chloride flow even if strictly speaking a chloride is not present.) The resulting gas flow is continued until the second layer thickness is achieved.

Particularly advantageous multi-layer devices such as semiconductor devices, e.g., photodetectors, are producible utilizing the inventive technique with a single precursor flow configuration. For example, it is possible to fabricate p-i-n photodetectors such as those described in *IEEE Electron Device Letters, EDL*-2, S. R. Forrest et al, page 283 (1981). In this fabrication procedure, an n+ indium phosphide substrate, e.g., a sulfur or tin doped substrate, is first etched using the liquid source gas flow and phosphorus trichloride. An undoped indium phosphide layer is then deposited by terminating the phosphorus trichloride flow directly into the chamber and initiating the indium phosphide solid source gas flow. The indium phosphide solid source gas flow is terminated, and the gallium arsenide solid source gas flow is initiated to produce indium gallium arsenide deposition on the underlying indium phosphide layer. The resulting structure has extremely pure layers, as shown by automatic C-V profiling, as described in *IEEE Transactions on Electron Devices, ED*-19, G. L. Miller, page 1103 (1972), indicating a free carrier concentration of $2 \times 10^{14}$ cm$^{-3}$ for the indium gallium arsenide and $6 \times 10^{14}$ cm$^{-3}$ for the indium phosphide. Additionally, the interface quality as indicated by X-ray diffraction is quite good. The device is then completed utilizing conventional techniques, such as those described in S. R. Forrest et al supra.

The following example is illustrative of the invention.

EXAMPLE

The furnace was heated and adjusted to provide a temperature of approximately 680 degrees C. in the substrate region, 40, approximately 750 degrees C. in the solid source region, 42, and 750 degrees C. in the liquid source region, 8. The gallium arsenide boat, 45, was moved to position, 42, with magnetic coupler, 49, and the indium phosphide boat, 60, was moved to position, 42, with magnetic coupler, 61. A hydrogen flow of 200 sccm was established through an arsenic trichloride bubbler, heated to a temperature of approximately 19 degrees C., and then through the cracking tube, 50, which reduced the arsenic trichloride/hydrogen mixture to As$_4$ and hydrogen chloride. (This flow was continued unchanged through all subsequent growth steps.) A flow of 28 sccm of hydrogen was also established through a phosphorus trichloride bubbler heated to a temperature of approximately −15 degrees C. and initially introduced into the reactor together with an additional hydrogen flow of 250 sccm through tube, 30, which bypassed all of the sources. A hydrogen flow of 62 sccm was introduced into tube, 34, and a hydrogen flow of 462 sccm was introduced into tube, 35. When the flows had stabilized, a tin-doped substrate, 55, having its major surface 6 degrees from the (100) plane toward the (110) plane was inserted onto the sample holder, 56, and brought to region, 40. Polycrystalline indium phosphide initially formed on the substrate until the substrate reached the furnace temperature. The polycrystalline indium phosphide was then etched by the hydrogen chloride formed from the gas flow. The etch was continued for a total of 5 minutes.

Indium phosphide growth was initiated by switching the phosphorous trichloride flow from the bypass tube, 30, to the indium phosphide source tube, 35, while reducing the hydrogen flow from 462 to 62 sccm. Additionally, a hydrogen flow of 650 sccm was established through tube, 30. (Reaction of the phosphorus trichloride with the indium phosphide eliminated the free hydrogen chloride and initiated growth.) After 30 minutes and the deposition of approximately 5 μm of indium phosphide, In$_{0.53}$Ga$_{0.47}$As growth was begun. The indium phosphide boat, 60, was removed from the heated region of the source tube, 42, with the magnetic coupler, 61, to prevent P$_4$ from the indium phosphide decomposition from contaminating the In$_{0.53}$Ga$_{0.47}$As layer. The transition from indium phosphide growth to indium gallium arsenide was accomplished by terminating the phosphorus trichloride bubbler flow, by establishing a hydrogen flow of 90 sccm into tube, 35, and by initiating a flow of 62 sccm from the arsenic trichloride bubbler (7.6 degrees C) to the gallium arsenide source tube, 34. When growth of the In$_{0.53}$Ga$_{0.47}$As layer was complete after approximately 80 minutes, the substrate was withdrawn to the cool region of the reactor tube.

A profile of the resulting layer is shown in FIG. 3 as obtained by a Miller automatic feedback profiler and Hg-probe. The apparent carrier concentration dip on the indium phosphide side and the apparent rise on the indium gallium arsenide side of the indium gallium arsenide/indium phosphide interface were due to the bandgap discontinuity.

Figure 4:
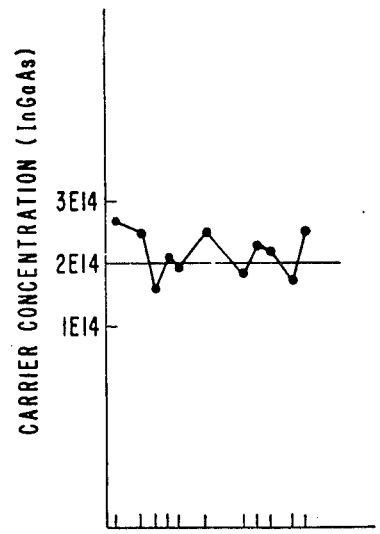

The indium gallium arsenide carrier concentration for a sequential series of similarly grown structures is shown in FIG. 4. The consistently low carrier concentration in the neighborhood of $2 \times 10^{14}$ cm$^{-3}$ is indicative of the reproductive high quality of layers grown by the inventive technique.

What is claimed is:

1. A process for forming a device comprising the steps of forming at least one precurser gas flow, subjecting a substrate to said flow to deposit a material, and completing said device. characterized in that
   at least one of said precursor gas flows is formed from at least one liquid source gas flow and at least one solid source gas flow, wherein said solid source gas flow is formed by subjecting a heated solid comprising a III-V semiconductor material that includes a constituent chosen from the group consisting of P and As to a chlorine entity containing gas flow, wherein said liquid source gas flow is formed by subjecting a liquid to a separate chlorine entity containing gas flow and wherein said liquid source gas flow is combined with said solid source gas flow after said heated solid is subjected to said chlorine entity containing gas flow.

2. The process of claim 1 wherein a multiplicity of gas flows is formed and exists simultaneously at least at some time during said deposition.

3. The process of claim 2 wherein said liquid comprises molten indium.

4. The process of claim 2 wherein said liquid comprises molten gallium.

5. The process of claim 2 wherein said III-V semiconductor material is chosen from the group consisting of indium phosphide and gallium arsenide.

6. The process of claim 5 wherein said chlorine entity is formed from a composition comprising a member chosen from the group consisting of arsenic trichloride and phosphorous trichloride.

7. The process of claim 2 wherein said chlorine entity is formed from a composition comprising a member chosen from the group consisting of arsenic trichloride and phosphorous trichloride.

8. The process of claim 1 wherein one precursor gas flow exists at any time during said deposition.

9. The process of claim 8 wherein said liquid comprises molten indium.

10. The process of claim 8 wherein said liquid comprises molten gallium.

11. The process of claim 8 wherein said III-V semiconductor material is chosen from the group consisting of indium phosphide and gallium arsenide.

12. The process of claim 11 wherein said chlorine entity is formed from a composition comprising a member chosen from the group consisting of arsenic trichloride and phosphorus trichloride.

13. The process of claim 8 wherein said chlorine entity is formed from a composition comprising a member chosen from the group consisting of arsenic trichloride and phosphorus trichloride.

14. The process of claim 8 wherein said precursor gas flow is modified during said deposition by the step comprising modifying the gas flow contributed from said at least one solid source.

15. The process of claim 14 wherein said solid source gas flow comprising a first solid source gas flow is changed for a second solid source gas flow.

16. The process of claim 15 wherein said liquid comprises molten indium.

17. The process of claim 15 wherein said liquid comprises molten gallium.

18. The process of claim 15 wherein said solid of said first solid source gas flow comprises a III-V semiconductor material chosen from the group consisting of gallium arsenide and indium phosphide.

19. The process of claim 18 wherein said chlorine entity is formed from a composition comprising a member chosen from the group consisting of arsenic trichloride and phosphorous trichloride.

20. The process of claim 18 wherein said solid of said second solid source gas flow comprises a III-V semiconductor material chosen from the group consisting of indium phosphide and gallium arsenide.

21. The process of claim 15 wherein said second source solid source gas flow comprises a III-V semiconductor material chosen from the group consisting of indium phosphide and gallium arsenide.

22. The process of claim 14 wherein an additional solid source gas flow is added to said solid source gas flow.

23. The process of claim 14 wherein said solid source gas flow comprising a plurality of solid source gas flows is modified by terminating one of said plurality of flows.

24. The process of claim 1 wherein said material deposition comprises indium phosphide.

25. The process of claim 1 wherein said material deposition comprises gallium arsenide.

26. The process of claim 1 wherein said material deposition comprises indium gallium arsenide.

27. The process of claim 1 wherein said material deposition comprises indium gallium arsenide phosphide.

28. The process of claim 1 wherein said material deposition comprises two regions of differing composition.

* * * * *